United States Patent
Banine et al.

(10) Patent No.: US 7,462,850 B2
(45) Date of Patent: Dec. 9, 2008

(54) RADICAL CLEANING ARRANGEMENT FOR A LITHOGRAPHIC APPARATUS

(75) Inventors: Vadim Yevgenyevich Banine, Helmond (NL); Vladimir Vitalevitch Ivanov, Moscow (GB); Johannes Hubertus Josephina Moors, Helmond (NL); Bastiaan Theodoor Wolschrijn, Abcoude (NL); Derk Jan Wilfred Klunder, Geldrop (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 150 days.

(21) Appl. No.: 11/296,702

(22) Filed: Dec. 8, 2005

(65) Prior Publication Data

US 2007/0145295 A1   Jun. 28, 2007

(51) Int. Cl.
*H05G 2/00*   (2006.01)
(52) U.S. Cl. .................. 250/504 R; 250/492.1; 250/492.2; 250/493.1
(58) Field of Classification Search .......... 250/492.1, 250/492.2, 493.1, 504 R
See application file for complete search history.

(56) References Cited

U.S. PATENT DOCUMENTS 5,478,400 A * 12/1995 Shimizu .................. 118/733
2003/0231415 A1 * 12/2003 del Puerto ................ 359/883
2004/0051984 A1 * 3/2004 Oshino et al. ............. 359/845
2004/0065817 A1 * 4/2004 Singer et al. .............. 250/228
2004/0165160 A1 * 8/2004 Van Beek et al. .......... 355/30
2005/0111080 A1 * 5/2005 Bakker et al. ............. 359/350

OTHER PUBLICATIONS

Lewandowski, et al ("A pulsed, low-temperature beam of supersonically cooled free radical OH molecules" Chemical Physics Letters 395 (2004) 53-57).*
R. R. Chromik and E.J. Cotts, "A Study of the Kinetics and Energetics of Solid State Reactions in Pd/Sn Diffusion Couples", Department of Physics, Binghamton University, State University of New York, Binghamton, NY 13902-6016.

* cited by examiner

*Primary Examiner*—Jack I. Berman
*Assistant Examiner*—Michael Maskell
(74) *Attorney, Agent, or Firm*—Pillsbury Winthrop Shaw Pittman, LLP

(57) ABSTRACT

A cleaning arrangement is configured to clean an EUV optic of an EUV lithographic apparatus. The partial radical pressure ranges between 0.1-10 Pa. The cleaning arrangement can be configured inside a cleaning cocoon of the lithographic apparatus for offline cleaning. It can also be configured at particular positions inside the apparatus to clean nearby optics during production. In the pressure range of 0.1-10 Pa the penetration of atomic hydrogen into the optical devices is high, while the recombination to molecular hydrogen and hydrogen consumption is limited.

13 Claims, 7 Drawing Sheets

RADICAL CLEANING ARRANGEMENT FOR A LITHOGRAPHIC APPARATUS

BACKGROUND OF THE INVENTION

1. Field of the Invention

The present invention relates to a lithographic apparatus and cleaning method therefore. More particularly it relates to a radical cleaning arrangement for a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In current designs for lithographic apparatus operating in the EUV range (with wavelengths typically of 5-20 nm) of the electromagnetic spectrum it is desirable to provide highly reflective elements in order to condition and pattern a beam for transferring a pattern from a patterning device onto a substrate and for maintaining a high productivity of the lithographic tool. This part of the electromagnetic spectrum is very sensitive for transmission losses since the radiation is easily absorbed by most surfaces. For high reflectivity Mo/SI multilayer mirrors are made typically including a metal top layer such as a ruthenium (Ru) layer. The metal top layer is to prevent oxidation, but causes a decrease in reflectivity. Furthermore, the sources that are used to produce such EUV radiation are typically plasma sources, wherein current designs in particular use a tin source. These plasma sources have a tendency to produce, in addition to EUV radiation, a variety of debris particles, which may, without appropriate measures, migrate into the system and cause contamination and malfunction.

In particular, tin contamination from the plasma source will deposit on mirror elements and cause serious loss of reflectivity of the mirror. This is prevented by contraptions to catch the debris before it can do any harm. However, these contraptions can have a limited protection efficiency. Typically, such a contraption is a so-called foil trap which is designed to trap debris particles in substantially aligned foil plates. Downstream, relative to the direction of EUV radiation, a collector is typically configured to collect an optimal portion of radiation coming out of the EUV-source. Such a collector is typically an arrangement of mirror elements, which use a grazing incidence reflection for collecting and guiding incident radiation into a beam of EUV radiation. In particular for the mirror elements of the collector, but also for other mirror elements which are subject to contamination, it is therefore desirable to provide cleaning techniques to clean these mirror elements from contamination. One such technique is hydrogen cleaning. In this method, in particular in combination with a tin source, hydrogen radicals react with tin to form gaseous tin-hydrides ($SnH_4$). Another technique is halogen cleaning. Also a combined technique may be used, in particular, wherein tin oxides are reduced to tin using hydrogen, and where the thus formed tin is removed using halogen cleaning.

SUMMARY OF THE INVENTION

It is desirable to provide a EUV lithographic apparatus and a cleaning arrangement therefore that efficiently deals with contaminant removal.

Accordingly there is provided a cleaning arrangement configured to clean an optic from contamination by supplying at least one of hydrogen radicals and halogen molecules, wherein a partial pressure of the radicals/molecules ranges between 0.1-10 Pa.

In another aspect of the invention, there is provided an EUV lithographic apparatus. including a radiation source configured to generate EUV radiation; an EUV optic configured to direct the EUV radiation; and a cleaning arrangement according to the invention.

In another aspect of the invention, there is provided an EUV lithographic apparatus including a radiation source configured to generate EUV radiation; an illumination system configured to condition a radiation beam using the EUV radiation; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate; an EUV optic configured to direct the EUV radiation; and a cleaning arrangement configured to clean the EUV optic from contamination by supplying at least one of hydrogen radicals and halogen molecules, wherein a partial pressure of the radicals/molecules ranges between 0.1-10 Pa.

In another aspect of the invention, there is provided a method of cleaning contamination from an optic, including supplying at least one of hydrogen radicals and halogen molecules, wherein a partial pressure of the radicals/molecules ranges between 0.1-10 Pa.

In another aspect of the invention, there is provided an EUV lithographic apparatus including a radiation source configured to generate EUV radiation; an EUV optic configured to direct the EUV radiation; a cleaning arrangement configured to supply radicals or molecules in a pulsed way to a surface of the EUV optic so as to clean the EUV optic from contamination.

In another aspect of the invention, there is provided a method of cleaning contamination from an EUV optic, including supplying radicals or molecules to the EUV optic in a pulsed way.

In another aspect of the invention, there is provided an EUV lithographic apparatus including a radiation source configured to generate EUV radiation; an EUV optic configured to direct the EUV radiation, the EUV optic including a surface including palladium Pd; a cleaning arrangement configured to supply radicals or molecules to a surface of the EUV optic for a predetermined time period so as to restore reflectivity of the EUV optic by way of cleaning of Sn from the surface of the EUV optic, and/or interdiffusion of the remaining Sn into the Pd-layer.

In another aspect of the invention, there is provided a method of cleaning contamination from an EUV optic, including supplying radicals to the EUV optic for a predetermined time period so as to restore reflectivity of the EUV optic by way of cleaning of Sn from the surface of the EUV optic, and/or interdiffusion of the Sn into the Pd-layer.

Throughout the text unless indicated otherwise, the terms "hydrogen" and "hydrogen radicals" imply to include their isotopes as well, in particular, deuterium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
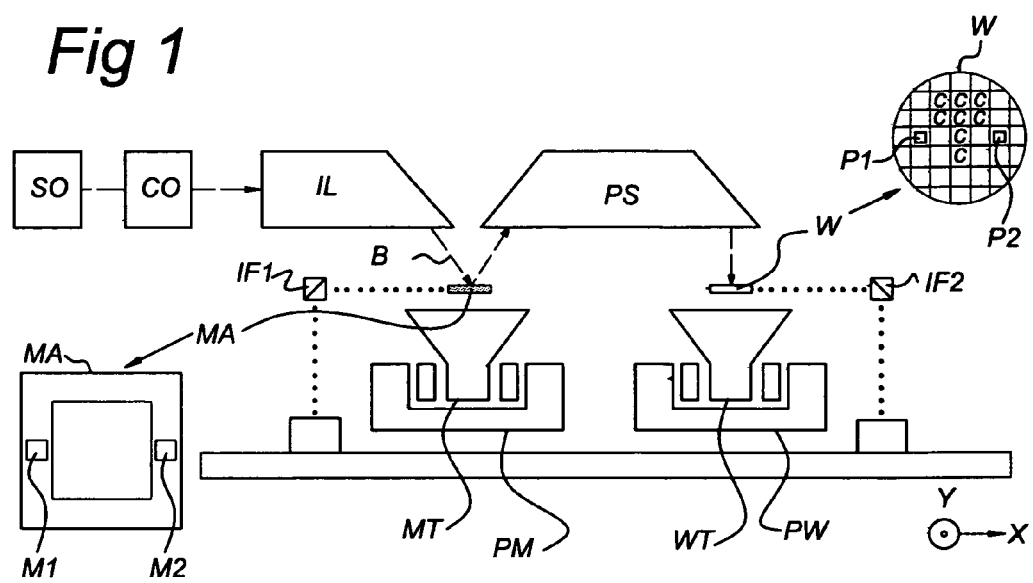
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation) A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a collector CO which receives radiation from a radiation source SO. The source SO and the lithographic apparatus may be separate entities, for example when the source is an excimer laser. In such cases the radiation beam may be passed from the source SO via the collector CO to the illuminator IL with the aid of a beam delivery system including, for example, suitable directing mirrors and/or a beam expander. In other cases the source may be an integral part of the lithographic apparatus, for example when the source is a mercury lamp. The source SO, the collector CO and the illuminator IL, together with the beam delivery system, if required, may be referred to as a radiation system.

The illuminator IL may include an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The following two reactions describe the generation of hydrogen radicals on a filament:

$$H_2 + S^* \leftrightharpoons H + SH \quad (1)$$

$$SH \leftrightharpoons H + S^* \quad (2)$$

Reaction (1) describes the dissociative adsorption of $H_2$ on an active filament surface site ($S^*$). In reverse direction, reaction (1) describes the H atom recombination on a hydrogen-terminated filament surface. Reaction (2) describes the desorption and adsorption of atomic hydrogen onto the filament surface. In order to produce gas-phase hydrogen atoms, they first need to be produced with reaction (1) and next they need to be desorbed with reaction (2). Changes in the temperature of the filament will influence the H atom filament production rate by affecting the mean lifetime of chemisorbed species on the filament surface, together with its energetic influence on the H atom formation reaction scheme. The temperature of the filament also affects the fraction of available $S^*$ and the local gas phase H atom number density which, in turn, influences the fraction of active sites with the reverse of reaction (2). In order to produce atomic hydrogen, the molecular hydrogen first has to be transported towards the surface. Therefore a diffusion limited atomic hydrogen production is well possible.

The lifetime of hydrogen radicals is limited by two reactions. The first loss mechanism for hydrogen atoms is recombination on the walls of the collector. The reactions for recombination look the same as reactions (1) and (2), with the only difference that in this case the atoms react with the walls of the vacuum system (Sw) instead of the filament:

$$H + Sw^* \rightarrow SwH \quad (3)$$

$$H + SwH \rightarrow H_2 + Sw^* \quad (4)$$

Reaction (3) describes the adsorption of a hydrogen atom onto the wall surface and reaction (4) shows the H atom recombination on a hydrogen-terminated wall surface. The recombination rate at the walls can be described in terms of recombination probability y for each atom striking the surface.

The second loss mechanism is three-body recombination and this is described by reaction (5):

$$H+H+M(H_2) \rightarrow H_2+M(H_2) \quad (5)$$

In this reaction, two hydrogen atoms recombine into a hydrogen molecule. The energy that is released with the recombination is transferred to a third molecule, which can for example be a hydrogen molecule M(H2) and momentum is transferred from the third body or towards the third body. The rate with which this reaction occurs depends (quadratic) on the (partial) pressure of H atoms [H] and the pressure of potential third bodies. A number of restrictions apply for using an optimal pressure regime in actual embodiments.

In particular, due to three-body recombination of hydrogen radicals into a hydrogen molecules the pressure in the system should be as low as possible to prevent too many losses due to three-body recombination since the efficiency of this process is limited by the total pressure and the number of hydrogen radicals that are present in the gas mixture. However, in the low pressure regimes (i.e. typically less than 100 Pa) a second loss mechanism takes over, which is recombination on the walls. Here hydrogen radicals are recombining in the presence of a surface. The recombination efficiency at reaction (1) depends on the type of surface material. In particular, the recombination constant is very high for metal surfaces as discussed. Taking this mechanism into account, the amount of losses due to this mechanism can be limited by making the pressure in the system as high as possible, in order to make the process diffusion limited. At these high pressure (i.e. typically more than 10 kPa) a compressor should be used. Furthermore, the problem with this method is that the gas usage will be very high and at high pressure the 3-body recombination will be large. This can be solved by flowing very hard so that there is limited time for collisions.

According to an aspect of the invention a method of cleaning contamination from an EUV optic is provided including the generation of at least one of hydrogen, halogen and iodine radicals, wherein a partial pressure of the radicals ranges between 0.1-10 Pa. It was found that at this partial pressure regime Sn cleaning or SnOx reduction in the collector of a lithographic apparatus is very successful. In the pressure range of 0.1-10 Pa the penetration of atomic hydrogen into the optical devices is high, while the recombination to molecular hydrogen and hydrogen consumption is limited.

Figure 2:
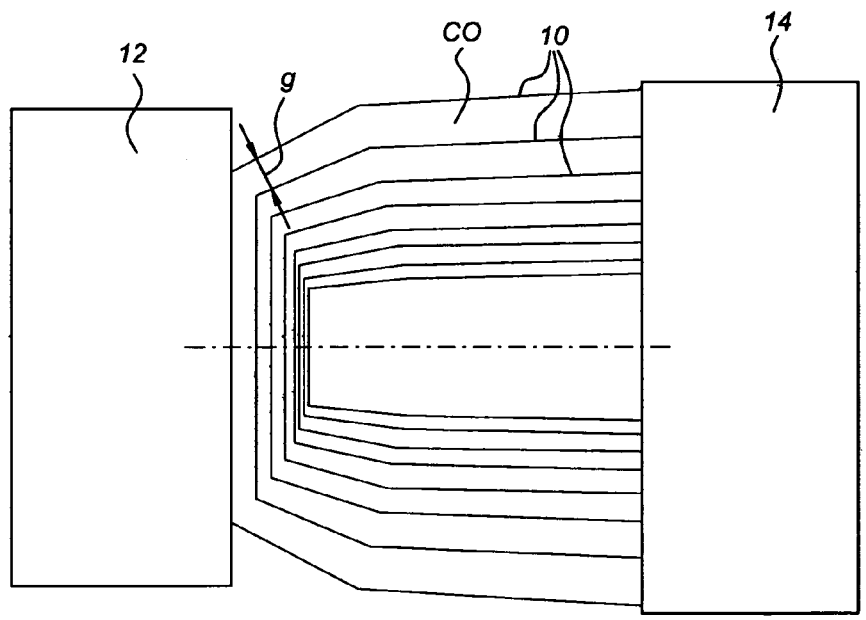
FIG. 2 depicts a collector of a lithographic apparatus surrounded by specific volumes.

FIG. 2 shows an embodiment, wherein the collector CO is removed from the lithographic apparatus and is cleaned. The collector CO includes a plurality of shells 10 which at an opening of the collector CO have an aperture g referred to as shell gap g.

The collector CO is placed in, for example, a cleaning cocoon so as to place the collector CO between two specific volumes, or enclosures, 12, 14, see FIG. 2. In one or both of the volumes 12, 14 radicals, such as H radicals are produced, wherein a pressure regime ranging between 1-10 Pa is used in order to create a flux so that the radicals will move through the collector CO. The H radicals may, for example, move from volume 12 to volume 14, thereby hitting the walls of the collector CO and clean the walls of the collector CO from, for example, Sn contamination.

Figure 3:
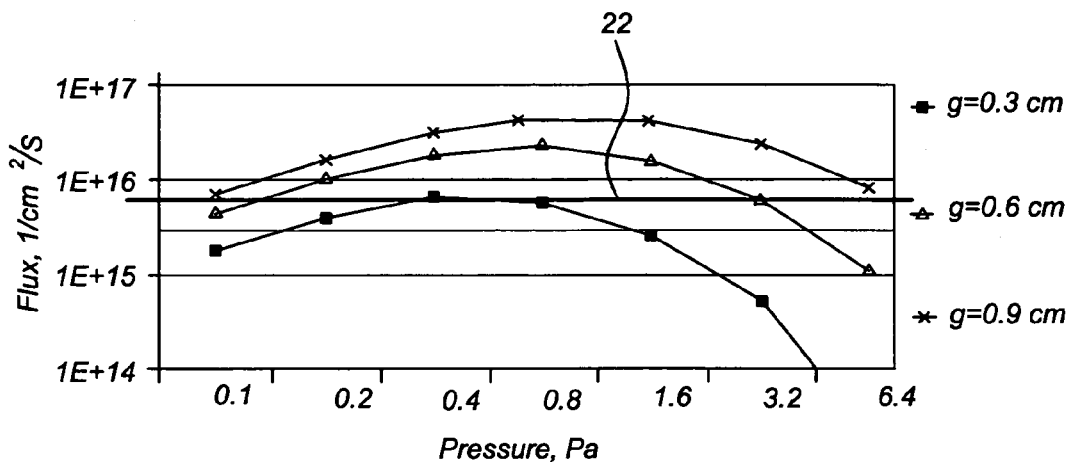
FIG. 3 depicts a graph of the flux of the cleaning particles as a function of partial pressure for three different shell gap distances.

FIG. 3 shows a graph of the flux of the radicals as a function of the pressure expressed in Pa. FIG. 3 shows three graphs, each at different collector shell gaps g. In FIG. 3, it shows that the flux decreases at higher pressures Pa. A line 22 indicates a flux level that is sufficiently high to clean a collector from Sn contamination. FIG. 3 shows that at a collector shell gap of 0.6 cm a sufficient flux can be generated at pressures between 0.2-3.2 Pa. At this low pressure regime the consumption of gas is very low and furthermore safety issues are easier to solve than other regimes.

In an embodiment of the invention, the radicals consumed in the collector CO are made externally from the collector in, for example, the door of the cocoon. See FIG. 4. A door 32 includes a plurality of gas inlets 34 and a plurality of filaments 36. The gas flow is directed from the gas inlets 34 towards the filaments 36. The pressure regime inside the door 32 of the cocoon is typically between 10-100 Pa. However, according to the invention, a pressure in the collector CO is only between 0.1-10 Pa, for example 0.8 Pa. At this pressure regime the mean free path of the radicals is sufficiently large for some radicals to reach deep into the collector CO. The mean free path λ is defined as the length of the path that molecules or atoms travel in between two collisions with other atoms or molecules, not including the shells of the collector CO.

Therefore it is dependent on the size of the atom (the cross-section of the collision) and the number density of the atoms on which it can collide:

$$\lambda = 1/(\sqrt{2}\ n \cdot \text{sigma}) \quad (6)$$

where n is the number density of the atoms/molecules and sigma the cross-section of the collisions [m²].

The number density n can be related to pressure:

$$n = p/(kB \cdot T) \quad (7)$$

where kB is the constant of Boltzmann (1.38×10⁻²³ joule/K), p the pressure and T the gas temperature in Kelvin.

For the cross-section one can take the dimensions of the atoms and molecules. When the H atoms are present in a gas of mainly H2 (e.g. 95% is still molecular), the dominating collisions for atoms will be the collisions of atoms with molecules:

$$\sigma = \pi(rH + rH2)^2 \quad (8)$$

where rH is the radius of the hydrogen atom (3×10⁻¹¹ m) and rH2 the half of the typical dimension of a H2 molecule (7.4×10⁻ m). For the cross-section we thus obtain:

$$\sigma = 3.4 \times 10^{-20}\ m^2 \quad (9)$$

Please note that this has to be considered as only a typical number.

When the temperature is room temperature (293 K) the mean free path λ can now be related directly to the pressure p.

$$\lambda = 8.4\ \text{cm} * (1\ \text{Pa})/p \quad (10)$$

Thus at 1 Pa and 293 K the mean free path λ will be 8.4 cm and at 10 Pa it is 0.8 cm.

Finally, the Knudsen number (Kn) is introduced:

$$Kn = d/\sigma,$$

where d is a typical dimension of the vessel/optics. In case of the collector, this will be the gap width g (see FIG. 2). In case of near normal mirrors this will be distance between filament and mirrors.

Referring to FIG. 3, at small pressures the flux of atomic hydrogen is limited since the total number of molecules and thus hydrogen atoms is limited. At higher pressures the flux will decrease when collisions are becoming important (Knudsen number<unity). For example, at a collector gap g equal to 0.9 cm the Knudsen number Kn is 1.1 at 10 Pa and at the maximum of the flux (1 Pa) the Knudsen number is 0.11. When the Knudsen number is smaller than unity, in this case 0.11, the mean free path of the atoms is 9 times larger than the typical dimension, implying that only a part of the atoms will collide when traveling from one wall in the collector to another. However, to penetrate the collector CO, the atoms have to pass this gap several times. For the calculation of which the results in FIG. 3 are shown the length of the collector is 11 cm and the atoms have to move typically 10-15 from wall to wall before the end of the collector CO is reached. Within the total movement the maximum in flux thus occurs at the onset of the atom-molecule collisions.

Figure 4:
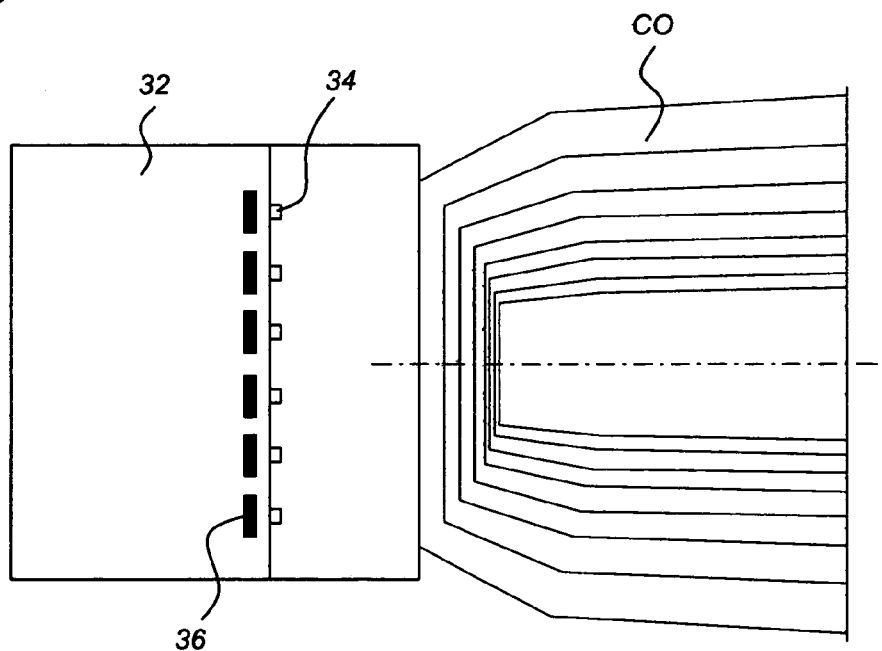
FIG. 4 depicts a collector showing the configuration of the cleaning arrangements.

Referring to FIG. 4, the filaments 36 are positioned so as to produce radicals into the collector CO. The radicals have a main direction towards the entries of the collector CO.

Figure 5:
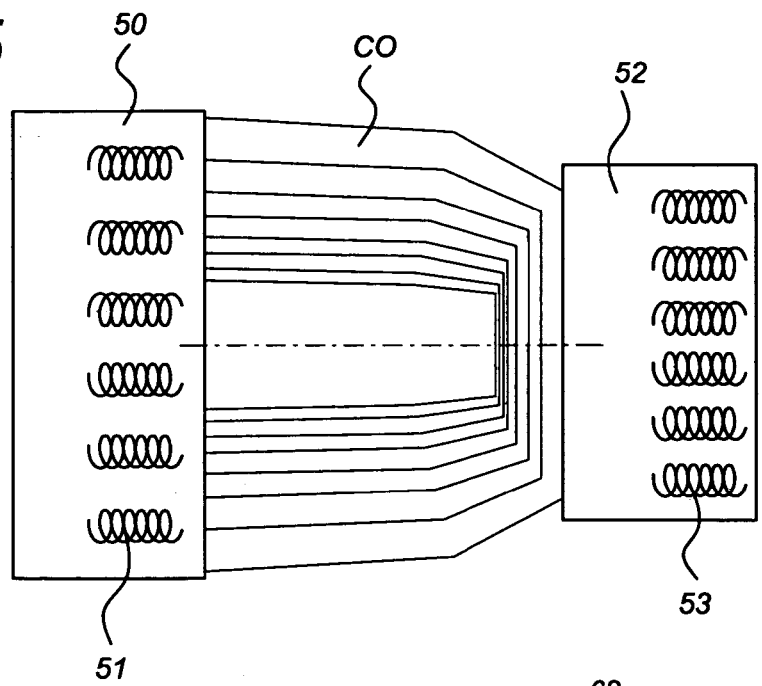
FIG. 5 depicts a collector and possible positions of the filaments.

Instead of removing the whole collector CO out of the lithographic apparatus, the collector CO can also be cleaned in situ. FIG. 5 schematically shows the collector inside a lithographic apparatus, in which in a first volume 50 a plurality of filaments 51 are placed configured to generate H radicals. In an embodiment the filaments 51 are placed so that they are in line of site with the surfaces of the collector shells 10. The filaments 51 can be circular in front of the circular openings of the collector CO.

Instead of placing the filaments in front (i.e., upstream) of the collector CO the filaments can also be placed downstream of the collector CO. The downstream filaments 53 are shown in FIG. 5. They are placed in a second volume 52, which, for example, can be part of the collector or another volume downstream the collector CO. In this embodiment, there are two inlets of molecular hydrogen into the collector CO. After passing the filaments 51, 53, respectively, the hydrogen is transferred into radicals which will reach the surfaces of the collector CO. The filaments 51, 52 can, for example, be made of tungsten (W), which operate at a temperature of 2200 K and have a diameter d of 0.4 mm. A typical voltage for the filaments is 1.2 V/cm and a typical current at that voltage is 0.7 A. A typical length of the filaments 51, 52 is 10 cm. By cleaning the collector CO in situ, there is no need for dismantling the lithographic apparatus.

Due to the fact that $H_2$ will be present in the projection system PS during exposure time, some amount of the $H_2$ will penetrate via the illuminator IL into the collector CO through the openings between the collector CO and the illuminator IL. Expected pressure of $H_2$ in this case is about 10 Pa, which gives the opportunity to place the filaments 53 in the collector volume 52 or in the interface between the collector volume 52 and the illuminator IL to perform the cleaning of the collector CO on-line. This means that cleaning of, for example, Sn contamination on the collector CO can be performed while exposing the substrate W.

Figure 6:
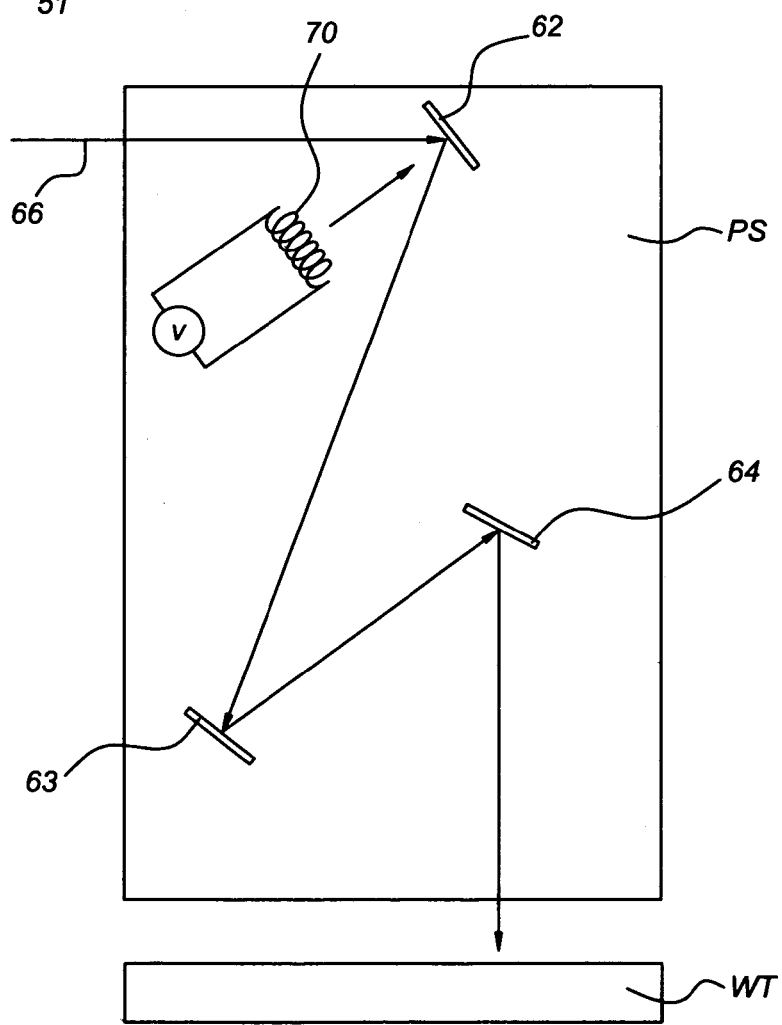
FIG. 6 depicts a projection system in which a mirror is cleaned by a cleaning arrangement according to an embodiment.

In another embodiment, the EUV optic configured to direct the EUV radiation is an EUV mirror in the projection system PS. This embodiment will be explained in more detail with reference to FIG. 6. The projection system PS includes one or more mirrors 62, 63, 64, configured to direct the EUV radiation 66 to the substrate table WT. FIG. 6 shows a possible location of a radical cleaning arrangement 70. The radical cleaning arrangement 70 may, for example, include a tungsten filament connected to a voltage supply. The voltage supply will heat the filament, which in turn will transfer the already present $H_2$ into H radicals. The radicals will reach the surface of the mirror 62 and thereby clean the surface of the mirror 62 from contamination. It should be noted that different configurations are possible. Instead of one radical cleaning arrangement 70 at each mirror more than one radical cleaning arrangement can be used. Note that no additional $H_2$ supply is needed in this configuration, due to the fact that $H_2$ is already present in the projection system PS during manufacturing conditions.

In an embodiment, the distance between the filament of the cleaning arrangement and the mirror 62 is between 5-50 cm. More specifically, the partial pressure at which there there is on average a single collision of a hydrogen atom before reaching the mirror 62 in this case is between 2 Pa (5 cm case) and 0.2 Pa (50 cm case).

Figure 7:
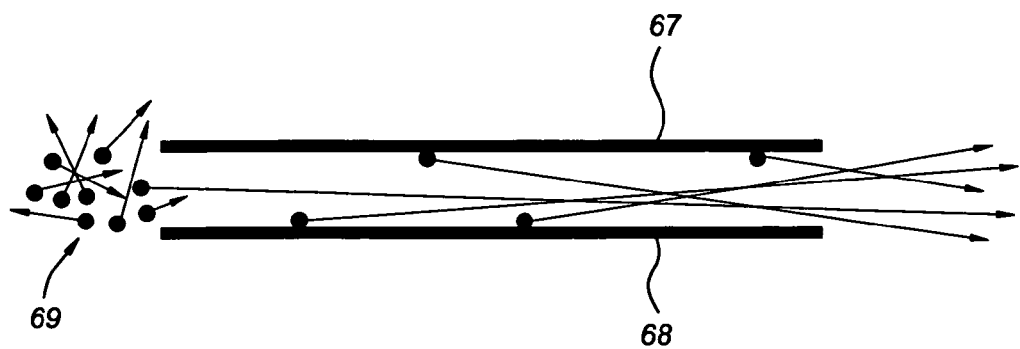
FIG. 7 depicts an embodiment including a guide with two guide plates placed in parallel.

According to an embodiment the EUV lithographic apparatus includes a guide for use in conjunction with the radical cleaning arrangement configured to direct radicals from the radical cleaning arrangement towards an EUV optic. FIG. 7 shows an example of this embodiment. The guide may include two guide plates 67, 68 placed in parallel. The guide plates 67, 68 may be made out of a material that does not terminate atomic hydrogen very efficiently, such as glass. A radical supply source 69 may be configured at an opening of the guide plates 67, 68 so that radicals will enter the space between the guide plates 67, 68. The guide plates 67, 68 will be placed close to each other, for example at a distance of about 1 mm. The distance may depend on the pressure inside the guide. The guide plates 67, 68 provide radicals produced by the radical supply source 69 with a direction of movement as shown in FIG. 7. The guide may include a pipe, which directs the radicals to the EUV optic to be cleaned. Due to this specific configuration of the guide, the randomly directed radicals at the radical supply source 69 will get a certain direction, thereby improving the efficiency of the cleaning. The efficiency is the highest when the atomic hydrogen creation is in a closed box made of a material with a low H termination probability, e.g. glass. The radical supply source 69 may for example be a source supplying hydrogen, halogen, or iodine radicals.

It should be appreciated that production of radicals can be done either by usage of hot filaments or by a RF method or other suitable methods. Furthermore, it should be appreciated that the production and injection of radicals into the collector CO can be performed simultaneously from two sides instead of only from one side. The non-mirror side of each shell of the collector CO should have a surface with low attachment for H, such as glass, PYREX® (borosilicate glass) or certain oxides. All other exposed surfaces, which are not part of the collector CO, are for example made of low attachment for H material or coating, such as glass, PYREX® or some certain oxides.

One of the problems with hydrogen radical cleaning is that the EUV optic becomes very hot due to heat generated by the filament and due to recombination of H radicals on the optic's surface. If the optic becomes too hot, it will become damaged (typical temperatures need to stay below 50° C., while the H-source has a temperature of >2000° C.). High temperatures lead to large interlayer diffusion in multilayer mirrors and hence to a lower reflectivity. At very high temperatures layers may even peel off or burst.

Therefore, according to an aspect of the invention, there is provided a lithographic apparatus including a radiation source configured to generate EUV radiation; an EUV optic configured to direct the EUV radiation; a radical cleaning arrangement configured to supply radicals in a pulsed way to a surface of the EUV optic so as to clean the EUV optic from contamination.

By using pulsed treatments, where the duration of each pulse is configured to make sure that the temperature of the EUV optic does not exceed the critical limit, damage can be prevented.

Figure 8:
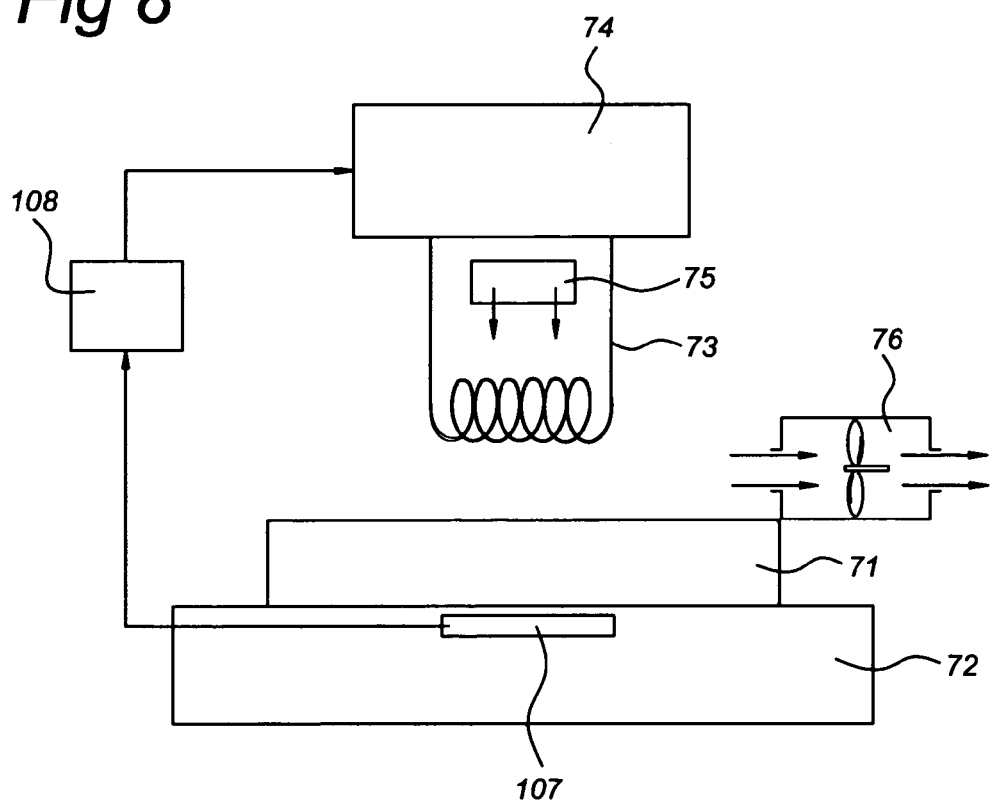
FIG. 8 depicts a radical cleaning arrangement configured to supply radicals in a pulsed way to a surface of an EUV optic.

Referring to FIG. 8, an EUV optic 71 is attached to a substrate or mirror holder 72. A filament 73 is arranged near the EUV optic 71 and is heated by flowing an electrical current through the filament, using a current controller 74. Hydrogen gas, originating from a hydrogen gas source 75 is flowing over the filament 73, where it is dissociated into hydrogen radicals, which hit the surface of the EUV optic 71. On the optic surface, the hydrogen radicals will remove contamination from the optic surface (for example contaminations such as Carbon or Sn). Any remaining hydrogen gas, hydrogen radicals and cleaning products are removed from the vacuum system with a vacuum pump 76. The EUV optic 71 may be an EUV mirror, a reticle, sensor, lens element or any other optical arrangement for directing radiation.

A carbon-cleaning experiment was performed using the cleaning method according to this embodiment, wherein a carbon-contaminated EUV mirror was treated with hydrogen radicals. After the treatment all carbon had been removed and the mirror appeared to be undamaged. The hydrogen treatment consisted of 10 cleaning cycles of each time 10 seconds exposure to hydrogen radicals generated with a hot tungsten-filament followed by a period of 0.5 hour without exposure, In an embodiment, the EUV optic includes a temperature monitor 107, such as for example a thermocouple 107. In this way, the temperature of the EUV optic 71 can be monitored. The thermocouple 107 is connected to a cleaning control unit 108 configured to determine the duration of the cleaning cycle, and the delay between subsequent pulses depending on the temperature measured. This feedback guarantees that the temperature of the EUV optic does not exceed a critical limit, so that damage to the EUV optic can be prevented.

Figure 9:
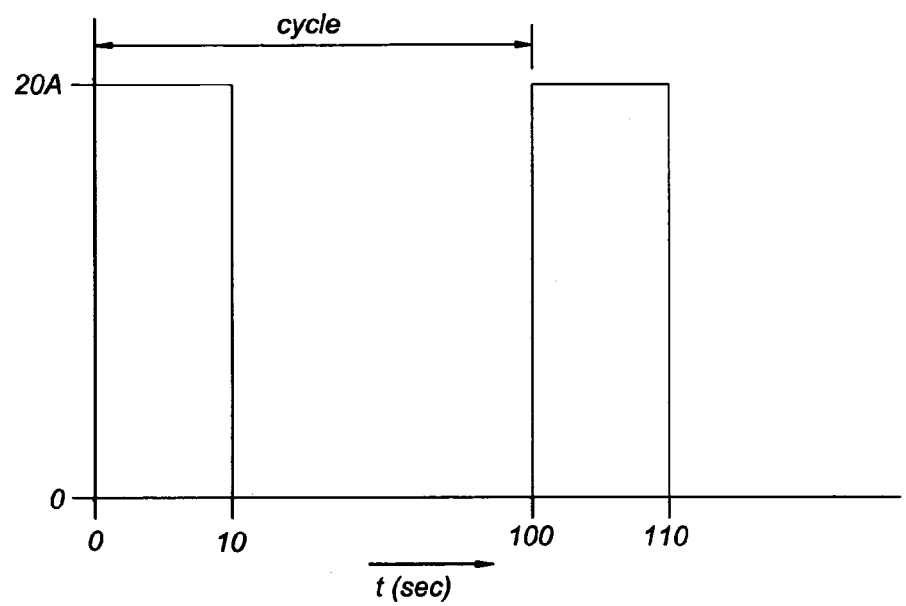
FIG. 9 depicts the output of a current controller of the embodiment of FIG. 8.

The cleaning control unit 108 may include a processor (not shown) configured to generate an output signal which is input to the current controller 74. The current controller 74 will output a current depending on its input signal. FIG. 9 shows an example of the output of the current controller 74. The current is 20 A during a period of 10 seconds. After this pulse, the current is zero for 90 seconds. Then the next pulse starts. Typically, about 30 pluses are produced to clean the EUV optic 71. In an embodiment, a delay between the pulses is between 100 sec. and 1000 sec.

If the temperature of the EUV optic 71 gets too high, a duty cycle of the pulses is reduced. For example, the pulses last only 5 seconds instead of 10 seconds. In an embodiment, the number of pulses does not depend on the temperature. Instead of changing the duty cycle of the pulses as a function of the measured temperature, the duration of each cycle can be a function of the measured temperature. It is also conceivable to determine the temperature of the filaments and use this as input for the cleaning control unit 10 in order to change the duty cycle as a function of the filaments temperature.

Typically the filament 73 has a diameter of about 0.4 mm and is heated to a temperature of typically 2500 K. According to an embodiment, a cleaning arrangement is used that supplies hydrogen radicals or halogen molecules. These gasses give good results for cleaning mirrors in the collector CO or in the illuminator IL.

Another problem when cleaning an EUV optic made of materials such as Ruthenium (Ru), is that the final layer of Sn is hard to remove from the Ru surface. A very thin Sn layer of several angstrom will remain. This thin layer is the reason that the reflectivity of the optic can not be recovered.

Therefore according to another aspect of the invention, there is provided a lithographic apparatus including a radiation source configured to generate EUV radiation; an EUV optic configured to direct the EUV radiation, the EUV optic including a surface including palladium Pd; a radical cleaning arrangement configured to supply radicals to a surface of the EUV optic so as to clean the EUV optic from Sn by way of removal of Sn from the surface of the EUV optic, and inter-diffusion of the remaining Sn into the Pd-layer.

According to an embodiment, the EUV optic is cleaned from Sn deposits by exposing it to, for example, hydrogen. Palladium has high interdiffusion of Sn, so during cleaning the Sn deposits are removed from the surface and remaining Sn will interdiffuse with the Pd material. The remaining top layer will be a mix of Sn and Pd and this layer has a relatively good EUV reflectivity which is determined by the ratio of Sn and Pd atoms in this top layer.

Figure 10:
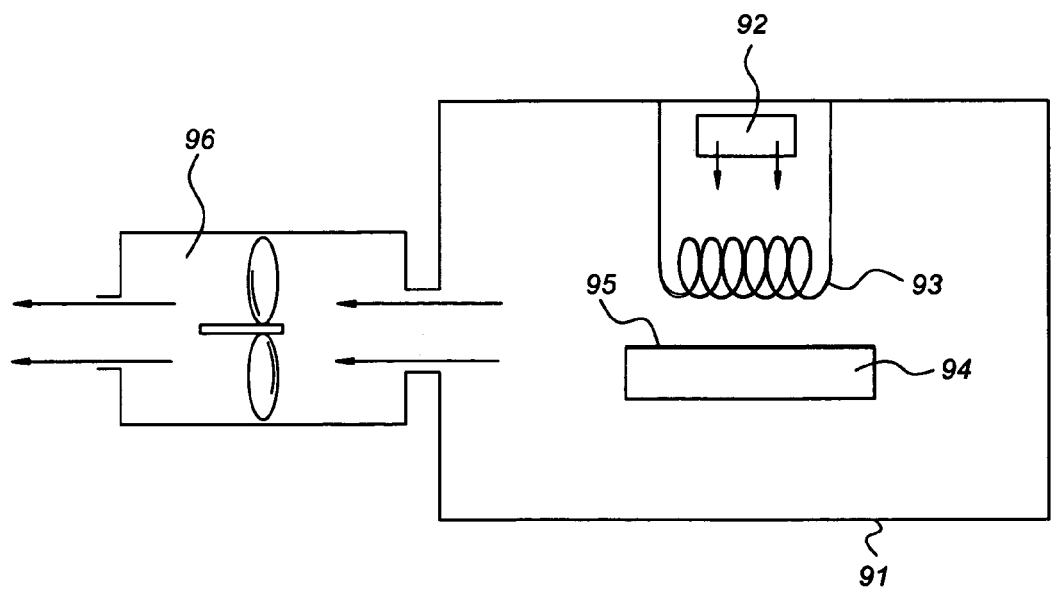
FIG. 10 depicts a setup for cleaning an EUV optic according to an embodiment of the invention.

FIG. 10 shows a setup for cleaning an EUV optic according to an embodiment of the invention. The setup consists of a vacuum chamber 91, a hydrogen gas source 92, a filament 93, an EUV optic 94 with Pd as reflective surface 95 and a vacuum pump 96. The filament 93 was heated and the gas source 92 was activated. The EUV optic 94 was exposed with radicals during a certain cleaning period. The reflectivity of the EUV optic 94 was measured before and after cleaning. Experiments were done on samples with 10 nm Sn on 100 nm Pd on a silicon substrate (referred to as PdSn samples). The results were very good. During the first experiment, a PdSn sample was exposed to hydrogen radicals for the shortest possible duration (between 2 and 20 seconds). The PdSn sample was then measured using an X-ray fluorescence (XRF) technique. From the XRF results (see Table 1) can be seen that with this treatment about 2.8 nm Sn has been removed. This is similar to results with a Ru substrate. A second treatment was done with the same PdSn samples, this time exposing the sample to three treatments of about 15 seconds. The surprising result was that in these treatments no Sn had been removed (see Table 2). When the experiment was repeated with another PdSn sample, the same behaviour repeated.

The explanation for the effect observed here is that the Sn and Pd layer are becoming intermixed. Auger analysis has shown that this is indeed the case. See FIG. 11. The formation of a $PdSn_4$ and $PdSn_3$ intermetallic layer has been studied by Chromik and Cotts, "A STUDY OF THE KINETICS AND ENERGETICS OF SOLID STATE REACTIONS IN Pd/Sn DIFFUSION COUPLES" http://www.binghamton.edu/physics/pub/kinetic2.pdf. They found that at temperatures above 200° C., a $PdSn_4$ intermetallic layer is forming rapidly. At higher temperatures also $PdSn_3$ is formed. The results from our experiments indicate that also at room temperature this effect is quite fast, because Auger analysis shows that the Pd and Sn layers are already intermixed for samples that have not been treated with hydrogen radicals yet (and therefore they have not been heated yet, except possibly during deposition).

TABLE 1

XRF results for experiment A

| sample | Sn ($\mu g/cm^2$) | Sn (nm) | Pd ($\mu g/cm^2$) |
|---|---|---|---|
| PdSn-1 before treatment | ~8 | 10.9 | ~196 |
| PdSn-1 after treatment | 5.9 | 8.1 | 196 |

TABLE 2

XRF results for experiment B

| sample | Sn ($\mu g/cm^2$) | Sn (nm) | Pd ($\mu g/cm^2$) |
|---|---|---|---|
| PdSn-1 before treatment | 5.9 | 8.1 | 196 |
| PdSn-1 after treatment | 5.9 | 8.1 | 200 |

Figure 11:
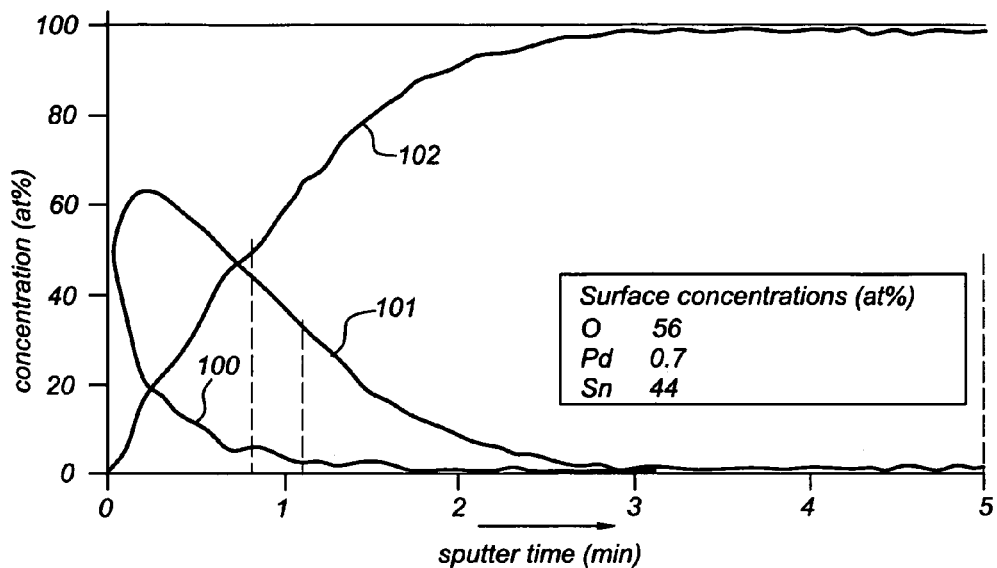
FIG. 11 depicts an Auger analysis of the EUV reflectivity of a PdSn sample before cleaning.
Figure 12:
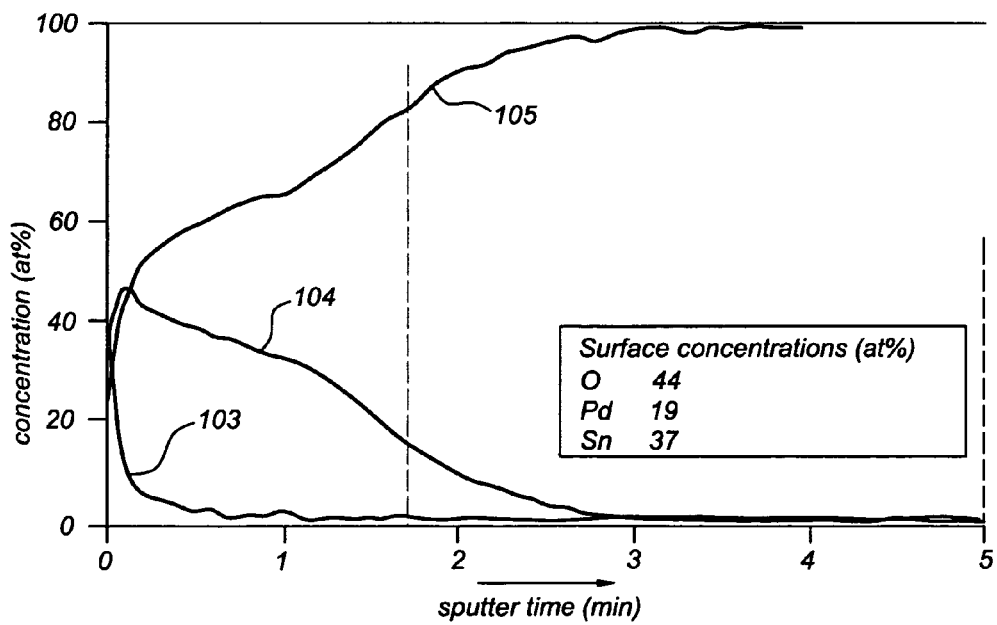
FIG. 12 depicts an Auger analysis of the EUV reflectivity of the PdSn sample of FIG. 11 after cleaning.

FIGS. 11 and 12 show an Auger analysis of the EUV reflectivity of a PdSn sample before (FIG. 11) and after (FIG.

12) cleaning. Please note that the x-axis of the Auger plots is actually equivalent to the depth in the sample. Furthermore it should be appreciated that the measured signal never represents a thin layer but is in fact averaged over several layers. In others words: a sharp real boundary will not be sharp in the Auger analysis.

In FIG. 11 a curve 100 indicates the concentration of oxygen. A curve 101 indicates the concentration of Sn and a curve 102 indicates the concentration of Pd. As can be seen from FIG. 11, there appears to be a very thin layer of Sn at the top, followed by a mixture of Pd and Sn. FIG. 12 shows the concentrations after treatment. A curve 103 indicates the concentration of oxygen, a curve 104 indicates the concentration of Sn and a curve 105 indicates the concentration of Pd. As can be seen from curve 104 and curve 105, most of the Sn that remains on the sample has been mixed with Pd. Note that curve 105 has moved to the left (i.e. closer to the interface with the mirror) as compared with curve 102 in FIG. 11.

Figure 13:
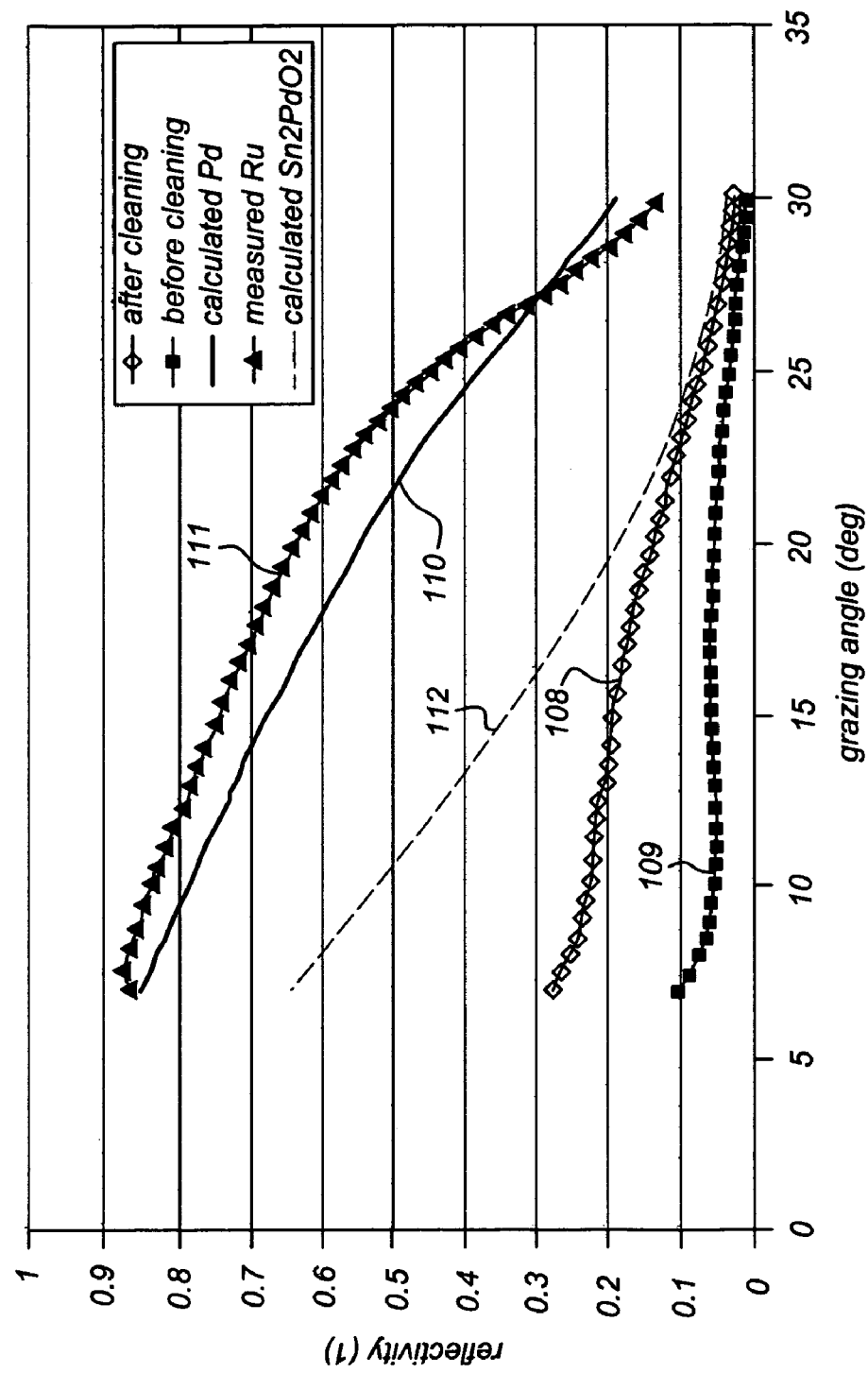
FIG. 13 depicts a comparison of the EUV reflectivity of the PdSn sample of FIGS. 11 and 12 before and after cleaning.

FIG. 13 shows a comparison of the EUV reflectivity of a particular PdSn sample before and after cleaning. Curve 109 represents the reflectivity of the PdSn sample before cleaning and the curve 108 represents the reflectivity after cleaning. For reference the reflectivity of a high-quality Pd mirror is shown, see line 110, and a measured Ru mirror is shown, see line 111. Finally, a line 112 has been added for the material $Sn_2PdO_2$ which has a similar composition to the cleaned mirror as measured and illustrated in FIG. 12.

FIG. 13 shows that indeed the EUV reflectivity has increased, even though there is still some Sn left on the sample. This is because the top layers of the sample are not pure Sn, but a combination of Pd and Sn. The EUV reflectivity therefore is not as high as a pure Pd sample, but it is somewhere between the reflectivity of Sn and Pd. It should also be noted that after cleaning the reflectivity is not as high as expected from calculations with the tool CXRO (for example $Sn_2PdO_2$, which has roughly the same surface concentrations as found in the Auger analysis, has a theoretical reflectivity of 55% at 10 degrees).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. Instead of cleaning an EUV mirror, the methods described above can be used for cleaning other optics, such as reticles, wafers, image sensors, wave front sensors, or energy sensors.

What is claimed is:

1. A cleaning arrangement configured to clean an optic from contamination by supplying hydrogen radicals, or halogen molecules, or both, wherein a partial pressure of the radicals/molecules ranges between 0.1-10 Pa.

2. An EUV lithographic apparatus, comprising:
a radiation source configured to generate EUV radiation;
an EUV optic configured to direct the EUV radiation;
a cleaning arrangement configured to clean an optic from contamination by supplying hydrogen radicals, or halogen molecules, or both, wherein a partial pressure of the radicals/molecules ranges between 0.1-10 Pa.

3. An EUV lithographic apparatus according to claim 2, wherein the cleaning arrangement is arranged in a line of sight with the optic.

4. An EUV lithographic apparatus according to claim 2, further comprising a guide for use in conjunction with the cleaning arrangement, configured to direct the radicals, or molecules, or both from the cleaning arrangement towards the optic.

5. An EUV lithographic apparatus according to claim 2, wherein the optic is a mirror element in an EUV collector.

6. An EUV lithographic apparatus according to claim 5, wherein a distance between shells of the collector is between 0.5 1.5 cm.

7. An EUV lithographic apparatus according to claim 2, wherein the optic is a mirror in a projection system of the lithographic apparatus.

8. An EUV lithographic apparatus according to claim 7, wherein a distance between the cleaning arrangement and the mirror is between 5-50 cm.

9. An EUV lithographic apparatus according to claim 2, wherein the contamination comprises Sn, or C, or both.

10. An EUV lithographic apparatus, comprising:
a radiation source configured to generate EUV radiation;
an illumination system configured to condition a radiation beam using the EUV radiation;
a support configured to support a patterning device, the patterning device being configured to impart the radiation beam with a pattern in its cross-section to form a patterned radiation beam;
a substrate table configured to hold a substrate;
a projection system configured to project the patterned radiation beam onto a target portion of the substrate;
an EUV optic configured to direct the EUV radiation; a cleaning arrangement configured to clean the EUV optic from contamination by supplying hydrogen radicals, or halogen molecules, or both, wherein a partial pressure of the radicals, or molecules, or both ranges between 0.1-10 Pa.

11. A method of cleaning contamination from an optic, comprising:
supplying hydrogen radicals, or halogen molecules, or both, wherein a partial pressure of the radicals, or molecules, or both, ranges between 0.1-10 Pa.

12. A method according to claim 11, further comprising:
placing a cleaning arrangement, the cleaning arrangement being configured to supply the hydrogen radicals, or halogen molecules, or both, in a line of sight with the optic.

13. A method according to claim 11, wherein the optic comprises a mirror in a EUV collector of a lithographic apparatus, and the cleaning takes place during exposure of a substrate by EUV radiation.

* * * * *